United States Patent
Li et al.

(10) Patent No.: US 11,981,845 B2
(45) Date of Patent: May 14, 2024

(54) QUANTUM DOT MATERIAL AND RELATED APPLICATIONS

(71) Applicants: Beijing BOE Technology Development Co., Ltd., Beijing (CN); BOE Technology Group Co., Ltd., Beijing (CN)

(72) Inventors: Dong Li, Beijing (CN); Yichi Zhang, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 474 days.

(21) Appl. No.: 17/421,223

(22) PCT Filed: Oct. 30, 2020

(86) PCT No.: PCT/CN2020/125496
§ 371 (c)(1),
(2) Date: Jul. 7, 2021

(87) PCT Pub. No.: WO2022/088097
PCT Pub. Date: May 5, 2022

(65) Prior Publication Data
US 2022/0403230 A1    Dec. 22, 2022

(51) Int. Cl.
*C09K 11/02*    (2006.01)
*B82Y 20/00*    (2011.01)
(Continued)

(52) U.S. Cl.
CPC .......... *C09K 11/025* (2013.01); *H10K 50/115* (2023.02); *B82Y 20/00* (2013.01); *B82Y 40/00* (2013.01)

(58) Field of Classification Search
CPC .......................... C09K 11/025; H10K 50/115
See application file for complete search history.

(56) References Cited

U.S. PATENT DOCUMENTS

| | | |
|---|---|---|
| 2018/0151817 A1 | 5/2018 | Cho et al. |
| 2018/0215695 A1 | 8/2018 | Chen |

(Continued)

FOREIGN PATENT DOCUMENTS

| | | |
|---|---|---|
| CN | 106083573 A | 11/2016 |
| CN | 106290891 A | 1/2017 |

(Continued)

OTHER PUBLICATIONS

Qiao, Bo et al., "Ion-Pair Oligomerization of Chromogenic Triangulenium Cations with Cyanostar-Modified Anions that Controls Emission in Hierarchical Materials", Journal of the American Chemical Society, Apr. 24, 2017, pp. 6226-6233, 139, 17.

(Continued)

*Primary Examiner* — C Melissa Koslow
(74) *Attorney, Agent, or Firm* — Workman Nydegger

(57) ABSTRACT

Embodiments of the present disclosure disclose a quantum dot material and related applications. The quantum dot material includes: quantum dots, and ligands connected with the quantum dots, and further includes isolation units, wherein the isolation units are cyclic molecules, and the ligands are configured to bond with the cyclic molecules through electrostatic force, so that the quantum dots and the ligands are wrapped with the multiple isolation units; and the isolation units are configured to isolate the quantum dots.

20 Claims, 10 Drawing Sheets

(51) Int. Cl.
    *B82Y 40/00*     (2011.01)
    *H10K 50/115*     (2023.01)

(56) References Cited

U.S. PATENT DOCUMENTS

| 2018/0372637 | A1* | 12/2018 | He | H10K 50/115 |
| 2020/0203578 | A1 | 6/2020 | Lin | |
| 2022/0140271 | A1* | 5/2022 | Li | H10K 71/233 |
| | | | | 257/13 |

FOREIGN PATENT DOCUMENTS

| CN | 106531860 A | 3/2017 |
| CN | 108102640 A | 6/2018 |
| CN | 109694340 A | 4/2019 |
| CN | 110205111 A | 9/2019 |

OTHER PUBLICATIONS

Fatila, Elisabeth M., "Anions Stabilize Each Other inside Macrocyclic Hosts", Angewandte Chemie International Edition, 2016, 55, 1-7.

Lee, Semin et al. A pentagonal cyanostar macrocycle with cyanostilbene CH donors binds anions and forms dialkylphosphate [3]rotaxanes, Nature Chemistry, Jun. 16, 2013, 1-7, DOI: 10.1038/NCHEM.1668.

\* cited by examiner

QUANTUM DOT MATERIAL AND RELATED APPLICATIONS

CROSS-REFERENCE TO RELATED APPLICATIONS

This application is a National Stage of International Application No. PCT/CN2020/125496, filed Oct. 30, 2020, which is hereby incorporated by reference in its entirety.

FIELD

The present disclosure relates to the technical field of display, in particular to a quantum dot material and related applications.

BACKGROUND

Quantum dots (QD), as a new type of luminescent material, have the advantages of high light color purity, high luminescent quantum efficiency, adjustable luminescent color, and long service life. It has become a current research hotspot of luminescent materials in novel light emitting diodes. Therefore, quantum dot light emitting diodes (QLED) that use quantum dot materials as light emitting layers have become the main direction of current research on novel display devices.

SUMMARY

An embodiment of the present disclosure provides a quantum dot material, including: quantum dots, and ligands connected with the quantum dots, and further including isolation units, wherein the isolation units are cyclic molecules, and the ligands are configured to bond with the cyclic molecules through an electrostatic force, so that the quantum dots and the ligands are wrapped with the multiple isolation units; and the isolation units are configured to isolate the quantum dots.

Optionally, in the quantum dot material provided by embodiments of the present disclosure, each of the ligands includes: a coordination group bonding with a corresponding quantum dot, a linking group connected with the coordination group, an ionic complex group connected with the linking group, and a charge balance ion; the ionic complex group and the charge balance ion are bond with each other and are opposite in charge; and the ionic complex group or the charge balance ion is configured to bond with the corresponding cyclic molecule through the electrostatic force.

Optionally, in the quantum dot material provided by embodiments of the present disclosure, the ionic complex groups are a cationic complex, the charge balance ions are a negative charge balance ion, and the negative charge balance ion is configured to bond with the cyclic molecules through the electrostatic force.

Optionally, in the quantum dot material provided by embodiments of the present disclosure, a material of the cationic complex is a first organometallic complex, and the first organometallic complex includes a first central metal ion and a ligand of the first central metal ion; the first central metal ion includes one of Ir, La, Nd, Eu, Cu, In, Pb or Pt; and the ligand of the first central metal ion includes one of o-phenanthroline, 2-phenylpyridine, phenyloxadiazole pyridine, fluorophenylpyridine or bipyridine.

Optionally, in the quantum dot material provided by embodiments of the present disclosure, a material of the negative charge balance ion is a second organometallic complex, and the second organometallic complex includes a second central metal ion and a ligand of the second central metal ion; the second central metal ion includes one of Ir, La, Nd, Eu, Cu, In, Pb or Pt; the ligand of the second central metal ion includes one of tetrakis(pentafluorophenyl)boric acid, tetrakis[(trifluoromethyl)phenyl]boric acid, tetrakis[bis(trifluoromethyl)phenyl]boric acid, hexa(pentafluorophenyl)phosphoric acid, hexa[(trifluoromethyl)phenyl]phosphoric acid or hexa[bis(trifluoromethyl)phenyl]phosphoric acid;

or the negative charge balance ion is one of:

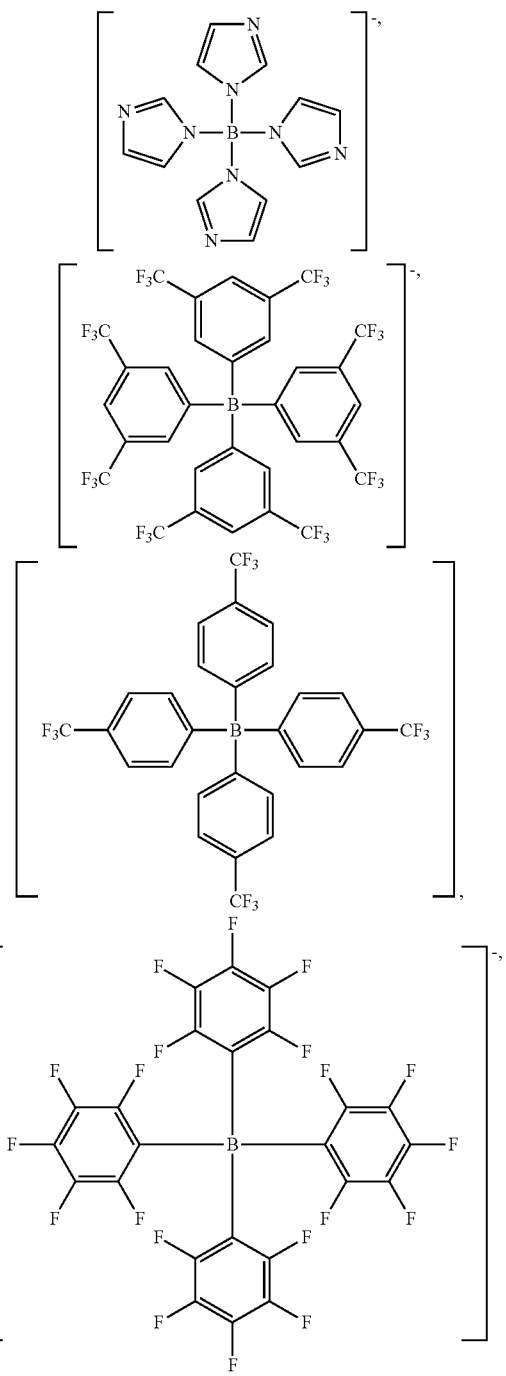

$ClO_4^-$, $BF_3^-$, $Cl^-$ or $PF_6^-$.

Optionally, in the quantum dot material provided by embodiments of the present disclosure, the ionic complex groups are an anionic complex, the charge balance ions are a positive charge balance ion, and the anionic complex is configured to bond with the cyclic molecules.

Optionally, in the quantum dot material provided by embodiments of the present disclosure, a material of the anionic complex is a second organometallic complex, and the second organometallic complex includes a second central metal ion and a ligand of the second central metal ion; the second central metal ion includes one of Ir, La, Nd, Eu, Cu, In, Pb or Pt; the ligand of the second central metal ion includes one of tetrakis(pentafluorophenyl)boric acid, tetrakisRtrifluoromethyl)phenyliboric acid, tetrakis[bis(trifluoromethyl)phenyl]boric acid, hexa(pentafluorophenyl)phosphoric acid, hexa[(trifluoromethyl)phenyl]phosphoric acid or hexa[bis(trifluoromethyl)phenyl]phosphoric acid;

or, the anionic complex is one of:

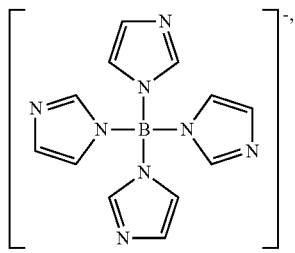

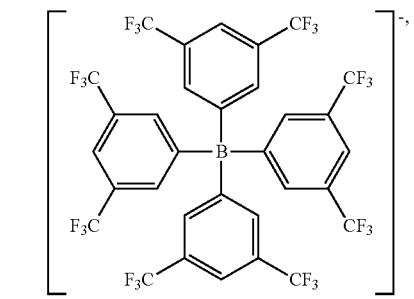

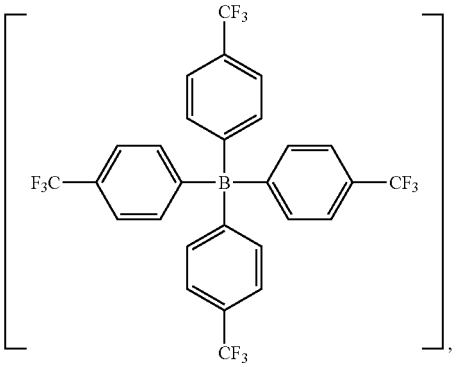

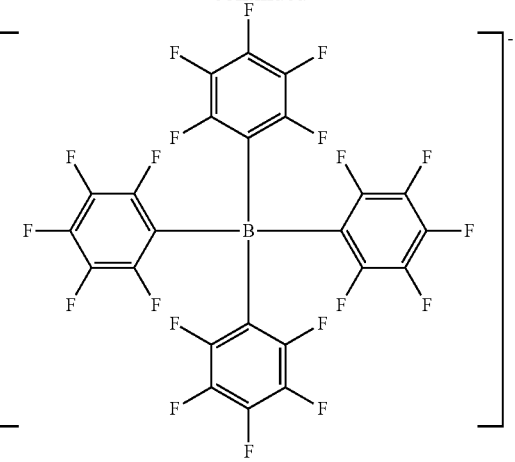

⟨?⟩ indicates text missing or illegible when filed

Optionally, in the quantum dot material provided by embodiments of the present disclosure, a material of the positive charge balance ion is a first organometallic complex, and the first organometallic complex includes a first central metal ion and a ligand of the first central metal ion; the first central metal ion includes one of Ir, La, Nd, Eu, Cu, In, Pb or Pt; the ligand of the first central metal ion includes one of o-phenanthroline, 2-phenylpyridine, phenyloxadiazole pyridine, fluorophenylpyridine or bipyridine;

or, the positive charge balance ion is $NH_4^+$ or $Na^+$.

Optionally, in the quantum dot material provided by embodiments of the present disclosure, the cyclic molecules include hydrogen atoms, and the ligands are configured to bond with the hydrogen atoms through the electrostatic force.

Optionally, in the quantum dot material provided by embodiments of the present disclosure, each of the cyclic molecules includes a cyclic molecule structure formed by connecting n repeating units in sequence, and $4 \leq n \leq 10$.

Optionally, in the quantum dot material provided by embodiments of the present disclosure, the cyclic molecules include: polymers of styrene or polymers of styrene derivatives.

Optionally, in the quantum dot material provided by embodiments of the present disclosure, a structure of each of the cyclic molecule is

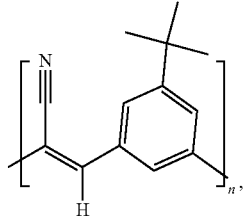

where $4 \leq n \leq 10$.

Optionally, in the quantum dot material provided by embodiments of the present disclosure, the structure of each of the cyclic molecules is:

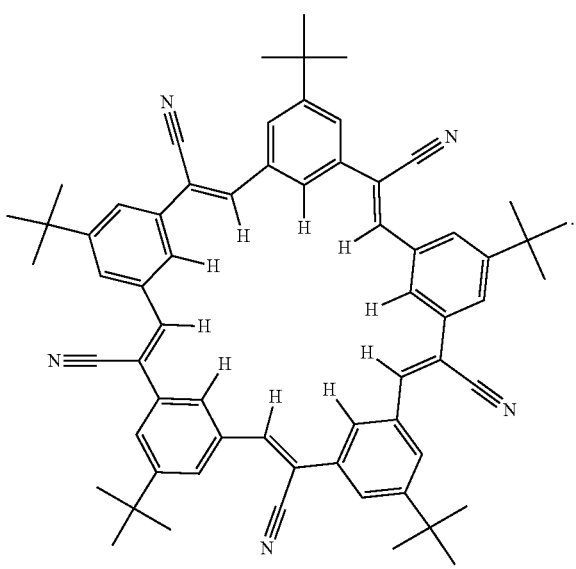 [SMILES: CC(C)(C)c1cc2cc(c1)/C(C#N)=C/c1cc(cc(C(C)(C)C)c1)/C(C#N)=C/c1cc(cc(C(C)(C)C)c1)/C(C#N)=C/c1cc(cc(C(C)(C)C)c1)/C(C#N)=C/c1cc(cc(C(C)(C)C)c1)/C(C#N)=C/2]

Optionally, in the quantum dot material provided by embodiments of the present disclosure, a distance between adjacent quantum dots is 5 nm-20 nm.

Optionally, in the quantum dot material provided by embodiments of the present disclosure, each of the linking groups includes at least one of: ethyl, n-butyl, t-butyl, n-octyl, t-butyl phenyl, methoxy or n-butoxy.

Optionally, in the quantum dot material provided by embodiments of the present disclosure, each of the coordination groups includes at least one of: amino, polyamino, hydroxyl, polyhydroxyl, sulfhydryl, polysulfhydryl, sulfide, polysulfide, phosphine or phosphine oxide.

On another aspect, an embodiment of the present disclosure further provides a method for manufacturing a quantum dot layer. The quantum dot layer includes the quantum dot material provided by embodiments of the present disclosure. The method includes:
    mixing quantum dots connected with ligands and cyclic molecule materials to form a mixed solution; and
    coating or printing the mixed solution to form the quantum dot layer,
    or,
    coating or printing a quantum dot solution connected with the ligands to form a quantum dot thin film; and
    dropping the cyclic molecule materials on the quantum dot thin film, and coating or printing to form the quantum dot layer.

On another aspect, an embodiment of the present disclosure further provides a quantum dot light emitting device, including:
    a drive substrate;
    a plurality of light emitting units, disposed in an array on the drive substrate;
    an insulating layer, located on a side, facing away from the drive substrate, of the plurality of light emitting units; and
    a color film layer, located on a side, facing away from the drive substrate, of the insulating layer, wherein a material of the color film layer is the quantum dot material provided by embodiments of the present disclosure.

On another aspect, an embodiment of the present disclosure further provides a method for manufacturing a quantum dot light emitting device, including:
    forming a plurality of light emitting units disposed in an array on a drive substrate;
    forming an insulating layer on a side, facing away from the drive substrate, of the plurality of light emitting units; and
    forming a color film layer on a side, facing away from the drive substrate, of the insulating layer, wherein a material of the color film layer is the quantum dot material provided by the embodiment of the present disclosure.
Forming the color film layer includes:
    mixing quantum dots connected with ligands and cyclic molecule materials to form a mixed solution; and
    coating or printing the mixed solution on the side, facing away from the drive substrate, of the insulating layer to form the color film layer,
    or,
    coating or printing a quantum dot solution connected with the ligands on the side, facing away from the drive substrate, of the insulating layer to form a quantum dot thin film; and
    dropping the cyclic molecule materials on the quantum dot thin film, and coating or printing to form the color film layer.

On another aspect, an embodiment of the present disclosure further provides a quantum dot light emitting device, including: an anode, a light emitting layer and a cathode disposed in a laminated manner. A material of the light emitting layer is the quantum dot material provided by embodiments of the present disclosure.

Optionally, the quantum dot light emitting device provided by embodiments of the present disclosure includes: a base substrate, and the anode, a hole injection layer, a hole transport layer, the light emitting layer, an electron transport layer and the cathode laminated in sequence on the base substrate.

Optionally, the quantum dot light emitting device provided by embodiments of the present disclosure includes: the base substrate, and the cathode, the electron transport layer, the light emitting layer, the hole transport layer, the hole injection layer and the anode laminated on the base substrate in sequence.

On another aspect, an embodiment of the present disclosure further provides a method for manufacturing a quantum dot light emitting device, including:
    forming an anode, a light emitting layer and a cathode disposed in a laminated manner. A material of the light emitting layer is the quantum dot material provided by embodiments of the present disclosure.

Optionally, the method provided by embodiments of the present disclosure includes:
    forming the anode on a base substrate;
    forming a hole injection layer on the anode;
    forming a hole transport layer on the hole injection layer;
    forming the light emitting layer on the hole transport layer;
    forming an electron transport layer on the light emitting layer; and
    forming the cathode on the electron transport layer.
Forming the light emitting layer includes:
    mixing quantum dots connected with ligands and cyclic molecule materials to form a mixed solution; and
    coating or printing the mixed solution on the hole transport layer to form the light emitting layer,
    or,
    coating or printing a quantum dot solution connected with the ligands on the hole transport layer to form a quantum dot thin film; and dropping the cyclic molecule materials on the quantum dot thin film, and coating or printing to form the light emitting layer.

Optionally, the method provided by embodiments of the present disclosure includes:

forming the cathode on the base substrate;
forming the electron transport layer on the cathode;
forming the light emitting layer on the electron transport layer;
forming the hole transport layer on the light emitting layer;
forming the hole injection layer on the hole transport layer; and
forming the anode on the hole injection layer.

Forming the light emitting layer includes:

mixing the quantum dots connected with the ligands and the cyclic molecule materials to form the mixed solution; and
coating or printing the mixed solution on the electron transport layer to form the light emitting layer, or, coating or printing the quantum dot solution connected with the ligands on the electron transport layer to form the quantum dot thin film; and
dropping the cyclic molecule materials on the quantum dot thin film, and coating or printing to form the light emitting layer.

On another aspect, an embodiment of the present disclosure further provides a display apparatus, including the quantum dot light emitting device provided by embodiments of the present disclosure.

DETAILED DESCRIPTION OF THE EMBODIMENTS

Figure 1:
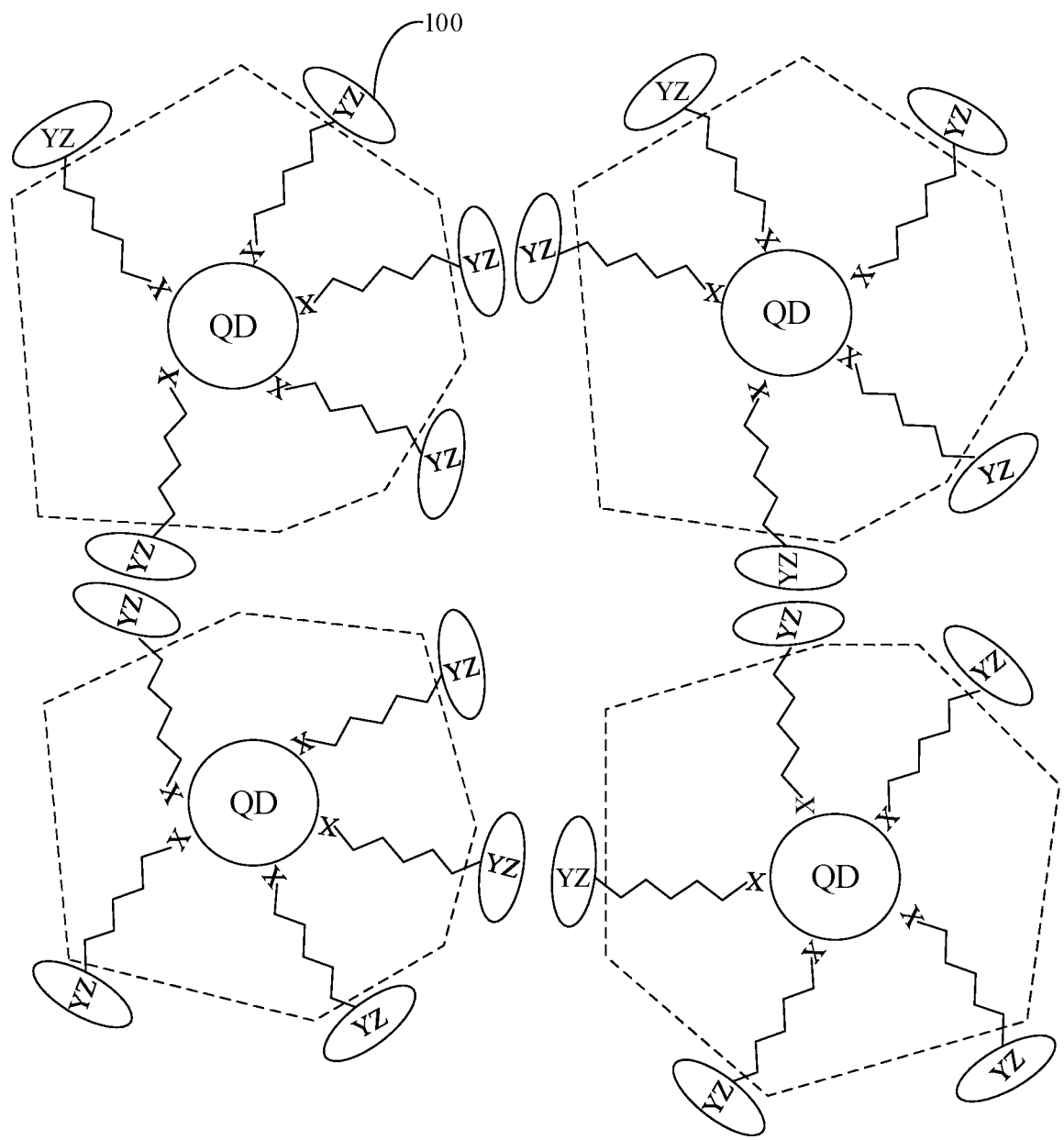
FIG. 1 is a schematic structural diagram of a quantum dot material provided by an embodiment of the disclosure.

In order to make the objectives, technical solutions, and advantages of the embodiments of the present disclosure clearer, the technical solutions in embodiments of the present disclosure will be clearly and fully described in combination with the accompanying drawings of the embodiments of the present disclosure. It is apparent that the described embodiments are some, but not all, embodiments of the present disclosure. Also, embodiments and features in the embodiments of the disclosure may be combined with one another without conflict. Based on the described embodiments of the present disclosure, all other embodiments attainable by one of ordinary skilled in the art without involving any inventive effort are within the scope of the present disclosure.

Unless otherwise defined, the technical terms or scientific terms used in the present disclosure shall have the usual meanings understood by those with ordinary skills in the field to which the present disclosure belongs. "Comprise" or "include" or other similar words used in the present disclosure mean that the element or item appearing before the word covers elements or items listed after the word and their equivalents, but does not exclude other elements or items. "Connecting" or "connected" or other similar words are not limited to physical or mechanical connections, but may include electrical connections, whether direct or indirect. The terms "inner, outer, upper, lower", and the like are used merely to denote a relative positional relationship that may change accordingly when the absolute position of the object being described changes.

It should be noted that the dimensions and shapes of the various figures in the drawings are not to scale and are intended to be merely illustrative of the present disclosure. The same or similar reference numerals refer to the same or similar elements or elements having the same or similar functions throughout.

Active matrix quantum dot light emitting diodes (AMQLED) have also received more and more attention due to their potential advantages in wide color gamut and long life. Its research has been deepened, its quantum efficiency has been continuously improved, and it has basically reached industrialization. It has become a future trend to further adopt new processes and technologies to realize its industrialization. At present, the fluorescence quantum yield of quantum dot materials is already very high, and it is much more stable than organic dyes. However, because the distance between quantum dots is too small, it is easy to cause fluorescence quenching and affect the luminous efficiency of devices. Therefore, the fluorescence yield of the quantum dot materials needs to be further improved.

Figure 2:
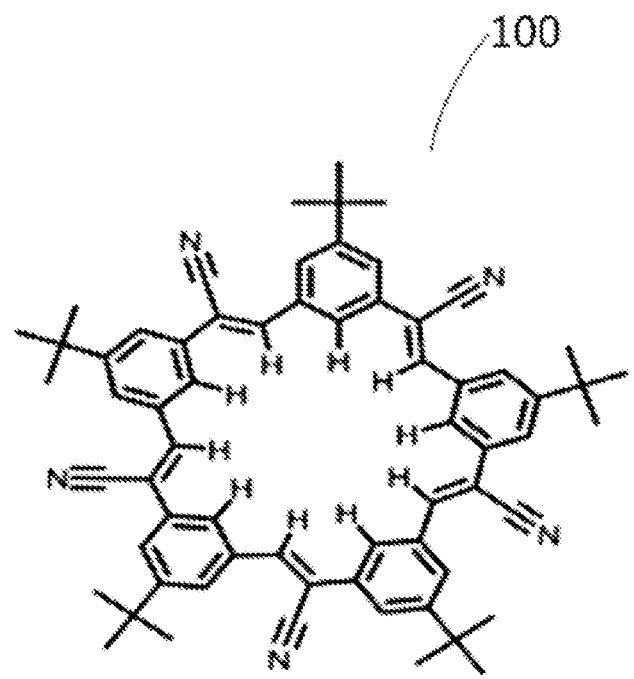
FIG. 2 is a schematic structural diagram of an isolation unit provided by an embodiment of the disclosure.
Figure 3:
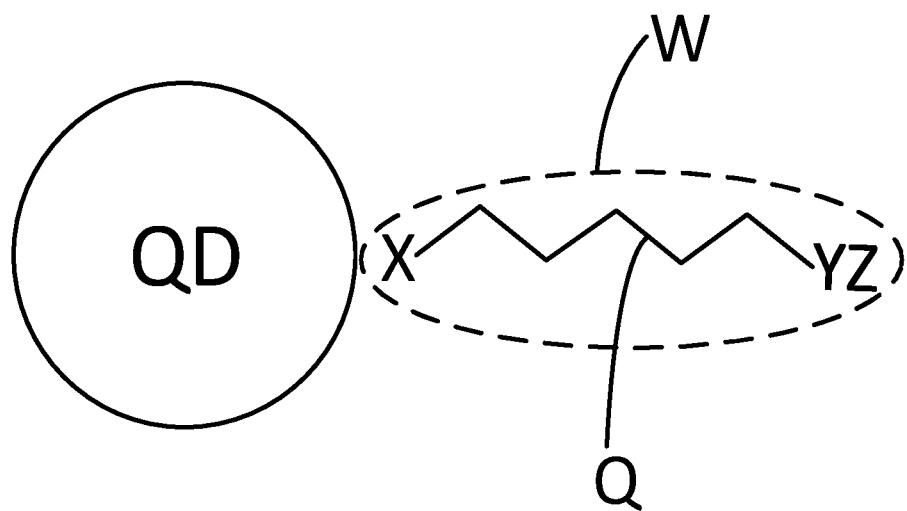
FIG. 3 is a schematic structural diagram of a quantum dot provided by an embodiment of the disclosure.

Therefore, in order to solve the problems, an embodiment of the present disclosure provides a quantum dot material, as shown in FIGS. 1 to 3. FIG. 1 is a schematic structural diagram of the quantum dot material, FIG. 2 is a schematic structural diagram of an isolation unit, and FIG. 3 is a schematic structural diagram of a quantum dot and a ligand connected with the quantum dot bulk. In FIG. 1, the isolation unit in FIG. 2 is simply represented by an ellipse. The quantum dot material includes: quantum dots QD and ligands W connected with the quantum dots QD. The quantum dot material further includes isolation units 100. The isolation units 100 are cyclic molecules, and the ligands W are configured to bond with the cyclic molecules through electrostatic force, so that the quantum dots QD and the ligands W are wrapped with the multiple isolation units 100, that is, the multiple isolation units 100 wrap the quantum dots QD and the ligands W as a whole (in FIG. 1, the quantum dots QD and the ligands W are inside the dashed frames, and the isolation units 100 are outside the dashed frames). The isolation units 100 are configured to isolate the quantum dots QD.

In some embodiments of the present disclosure, the isolation units 100 are the cyclic molecules, the ligands W connected with the quantum dots QD are configured to bond with the cyclic molecules through electrostatic force, and then each isolation unit 100 tightly bonding with the corresponding ligand W is formed on the outer surface of the overall structure of the corresponding quantum dot QD and the ligands W, so that the overall structure of the quantum dot QD and the ligands W is wrapped with the isolation units 100, and the problem of fluorescence quenching caused by the contact of the adjacent quantum dots is avoided, thereby improving the light emitting efficiency of a quantum dot layer, and improving the light emitting efficiency of a light emitting device where the quantum dot layer is located.

It should be noted that although the quantum dots and ligands are wrapped with the multiple isolation units, those skilled in the art can understand that the wrapping means that the quantum dots and ligands are not completely covered, and there may also be gaps between adjacent cyclic molecules, as long as it is guaranteed that the quantum dots are separated.

In the quantum dot material provided by embodiments of the present disclosure, as shown in FIG. 3, each ligand W includes: a coordination group X bonding with the quantum dot QD, a linking group Q connected with the coordination group X, an ionic complex group Y connected with the linking group Q, and a charge balance ion Z. The ionic complex group Y and the charge balance ion Z bond and are opposite in charge, and
the ionic complex group Y or the charge balance ion Z is configured to bond with the cyclic molecule through electrostatic force.

Figure 4:
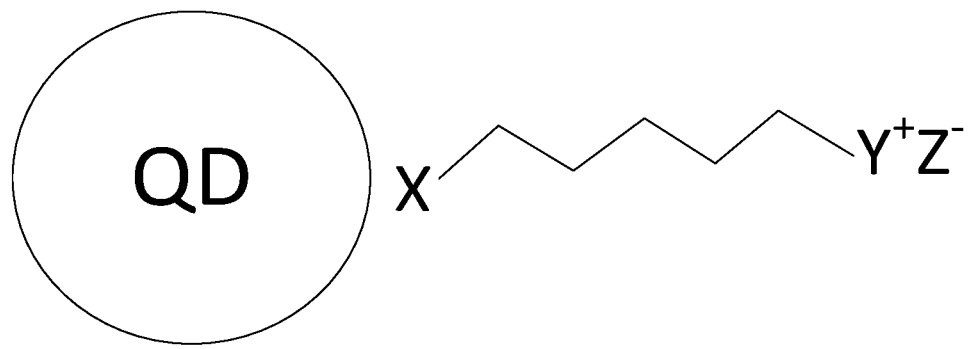
FIG. 4 is a schematic structural diagram of a quantum dot provided by an embodiment of the disclosure.

In specific implementation, in the quantum dot material provided by the embodiment of the present disclosure, as shown in FIG. 4, the ionic complex group Y is a cationic complex $Y^+$, the charge balance ion Z is a negative charge balance ion $Z^-$, and the negative charge balance ion $Z^-$ is configured to bond with the cyclic molecule in FIG. 2 through electrostatic force.

In some embodiments, as shown in FIG. 4, a material of the cationic complex $Y^+$ may be a first organometallic complex, and the first organometallic complex includes a first central metal ion and a ligand of the first central metal ion. The first central metal ion includes one of Ir, La, Nd, Eu, Cu, In, Pb or Pt. The ligand of the first central metal ion includes one of o-phenanthroline, 2-phenylpyridine, phenyloxadiazole pyridine, fluorophenylpyridine or bipyridine.

In the quantum dot material provided by embodiments of the present disclosure, as shown in FIG. 4, a material of the negative charge balance ion $Z^-$ may be a second organometallic complex, and the second organometallic complex includes a second central metal ion and a ligand of the second central metal ion. The second central metal ion includes one of Ir, La, Nd, Eu, Cu, In, Pb or Pt. The ligand of the second central metal ion includes one of tetrakis(pentafluorophenyl)boric acid, tetrakis[(trifluoromethyl)phenyl]boric acid, tetrakis[bis(trifluoromethyl)phenyl]boric acid, hexa(pentafluorophenyl)phosphoric acid, hexa[(trifluoromethyl)phenyl]phosphoric acid or hexa[bis(trifluoromethyl)phenyl]phosphoric acid.

Alternatively, the negative charge balance ion $Z^-$ is one of:

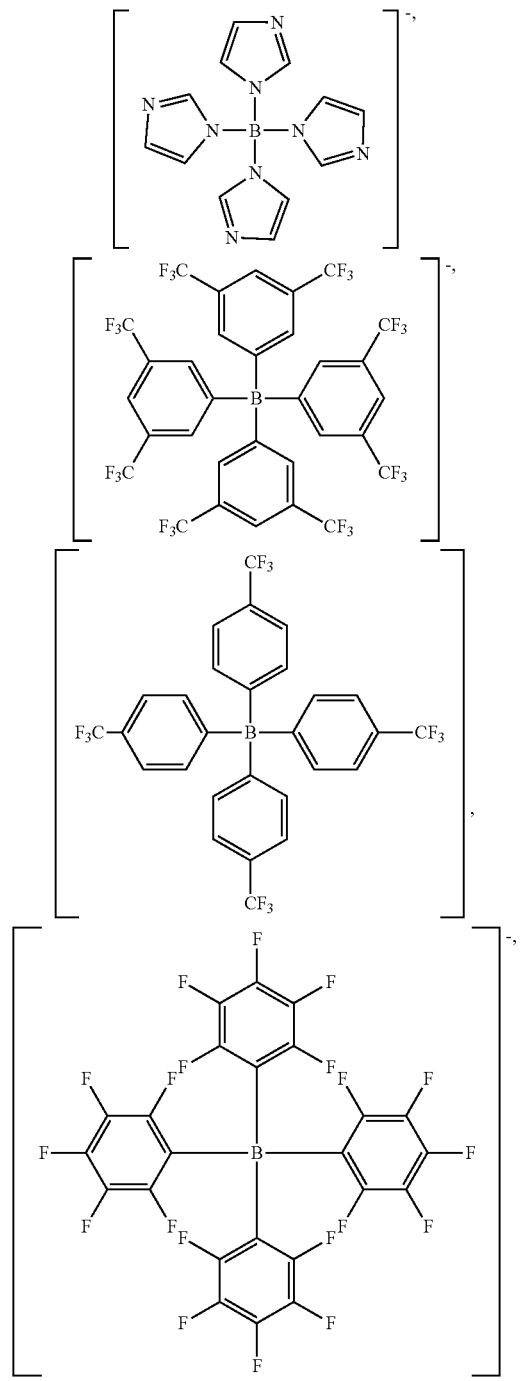

$ClO_4^-$, $BF_3^-$, $Cl^-$ or $PF_6^-$.

Figure 5:
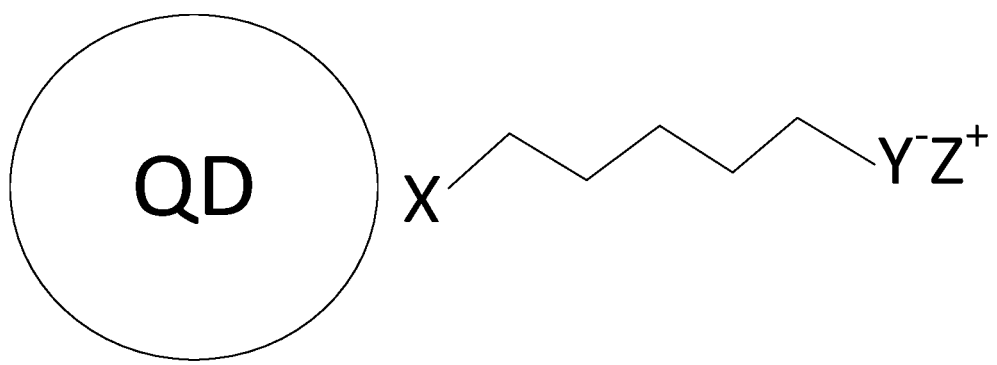
FIG. 5 is a schematic structural diagram of yet another quantum dot provided by an embodiment of the disclosure.

In the quantum dot material provided by embodiments of the present disclosure, as shown in FIG. 5, the ionic complex group Y is an anionic complex $Y^-$, the charge balance ion Z is a positive charge balance ion Z⁺, and the anionic complex Y⁻ is configured to bond with the cyclic molecule in FIG. 2.

In some embodiments, as shown in FIG. 5, a material of the anionic complex Y⁻ may be a second organometallic complex, and the second organometallic complex includes a second central metal ion and a ligand of the second central metal ion. The second central metal ion includes one of Ir, La, Nd, Eu, Cu, In, Pb or Pt. The ligand of the second central metal ion includes one of tetrakis(pentafluorophenyl)boric acid, tetrakis[(trifluoromethyl)phenyl]boric acid, tetrakis[bis(trifluoromethyl)phenyl]boric acid, hexa(pentafluorophenyl)phosphoric acid, hexa[(trifluoromethyl)phenyl]phosphoric acid or hexa[bis(trifluoromethyl)phenyl]phosphoric acid.

Alternatively, the anionic complex Y⁻ is one of:

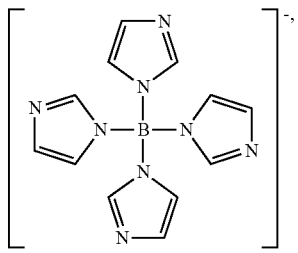

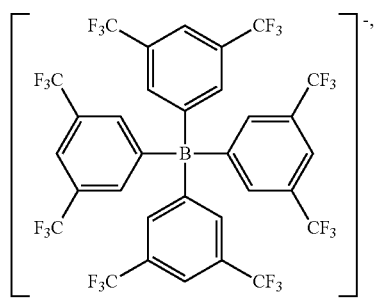

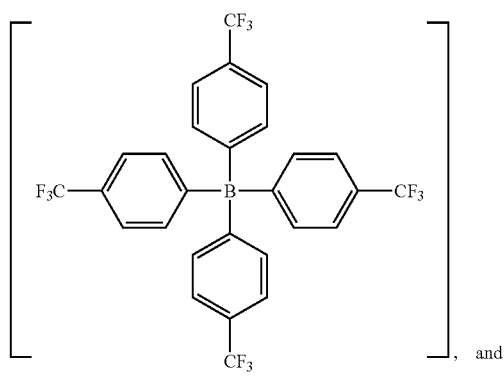, and

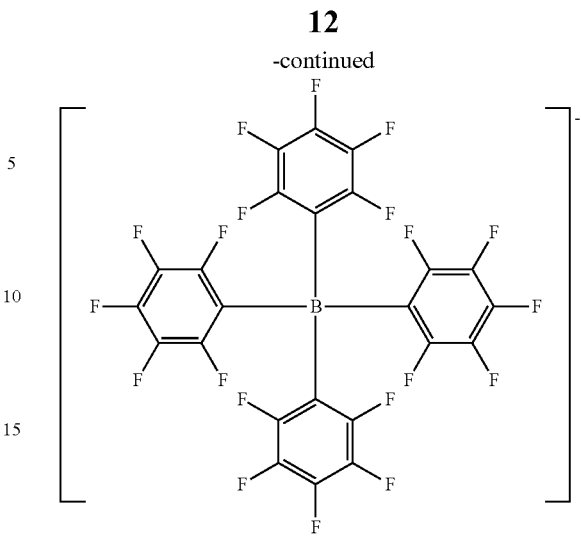

ⓘ indicates text missing or illegible when filed

In some embodiments, as shown in FIG. 5, a material of the positive charge balance ion Z⁺ may be a first organometallic complex, and the first organometallic complex includes a first central metal ion and a ligand of the first central metal ion. The first central metal ion includes one of Ir, La, Nd, Eu, Cu, In, Pb or Pt. The ligand of the first central metal ion includes one of o-phenanthroline, 2-phenylpyridine, phenyloxadiazole pyridine, fluorophenylpyridine or bipyridine.

Alternatively, the positive charge balance ion Z⁺ is $NH_4^+$ or $Na^+$.

Specifically, the cationic complex Y⁺ may be one of the following structures.

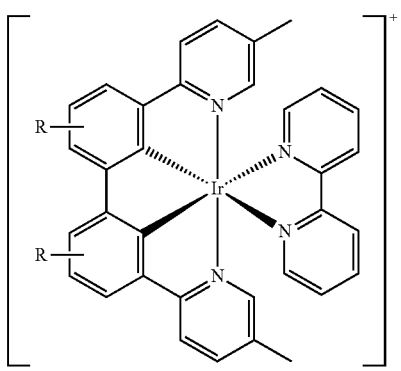

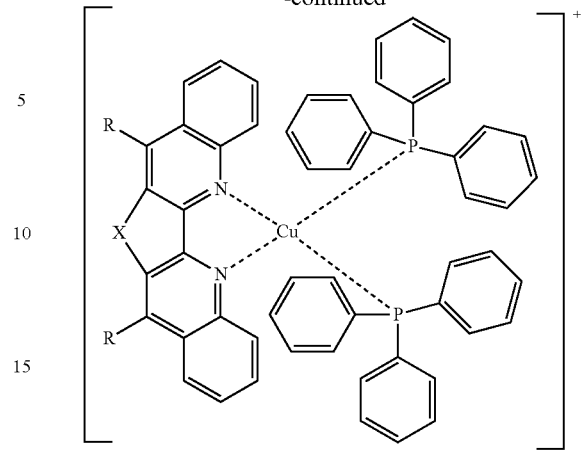

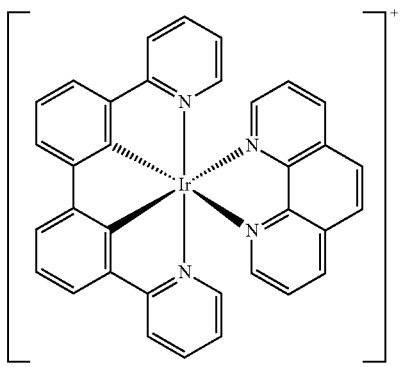

In the quantum dot material provided by embodiments of the present disclosure, as shown in FIG. 2, the cyclic molecule includes hydrogen atoms (H), and the ligand W is configured to bond with the hydrogen atoms through electrostatic force. As shown in FIG. 4, the negative charge balance ion $Z^-$ in the ligand W is configured to bond with the hydrogen atoms through electrostatic force; and as shown in FIG. 5, the anionic complex $Y^-$ in the ligand W is configured to bond with the hydrogen atoms through electrostatic force.

In the quantum dot material provided by embodiments of the present disclosure, each cyclic molecule includes a cyclic molecule structure formed by connecting n repeating units in sequence, and $4 \leq n \leq 10$.

In the quantum dot material provided by embodiments of the present disclosure, the cyclic molecules include: polymers of styrene or polymers of styrene derivatives.

In the quantum dot material provided by embodiments of the present disclosure, a structure of each cyclic molecule may be

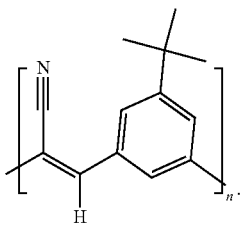

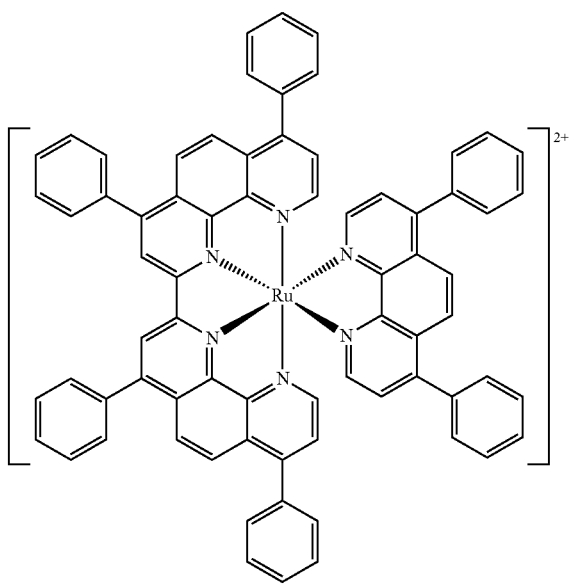

Optionally, the structure of each cyclic molecule may be as follows:

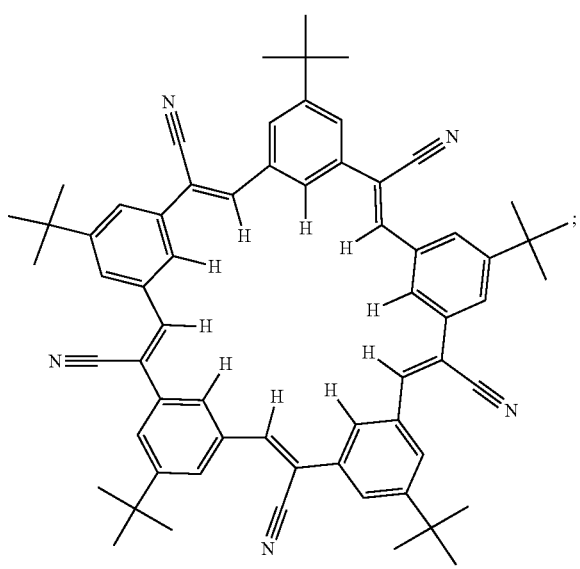 [SMILES: CC(C)(C)c1cc2cc(c1)/C(C#N)=C/c1cc(cc(C(C)(C)C)c1)/C(C#N)=C/c1cc(cc(C(C)(C)C)c1)/C(C#N)=C/c1cc(cc(C(C)(C)C)c1)/C(C#N)=C/c1cc(cc(C(C)(C)C)c1)/C(C#N)=C/2]

where the number n of repeating units is 5. That is, each cyclic molecule is a cyclic molecule structure formed by connecting five repeating units in sequence, the middle of which is a hollow structure and contains more hydrogen atoms (H), so the middle may tightly bond with the anion part of the ionic complex group.

It should be noted that the hydrogen atoms (H) in the central region of each cyclic molecule do not exist in a form of ions, but protons in the atoms (H) are all in a region within the ring, and electrons are all covalently bonded between the ring and the protons. Therefore, the region within the ring is an electron-deficient center, so as to tightly bond with anions.

It should be noted that since there are many ligands on the surface of the quantum dot bulk, and the central region of the cyclic molecule has 4-10 hydrogen atoms, taking the cyclic molecule shown in FIG. 2 as an example, there are five hydrogen atoms in the central region, assuming that one ligand bonds with one isolation unit, the same number of isolation units as the ligands are formed outside the quantum dot bulk; and if one ligand bonds with one hydrogen atom, it is equivalent that five ligands bond with one isolation unit. Due to the large number of the ligands, multiple isolation units may also be formed outside the quantum dot bulk.

The cyclic molecule of the isolation unit 100 shown in FIG. 2 is formed by connecting a plurality of styrene derivatives in sequence. Due to the formation of cyano (—C≡N) and tert-butyl (—C(CH$_3$)$_3$,) and other derivative groups, the steric hindrance of the cyclic molecule may be greater, and the effect of isolating contact of the quantum dots may be better. Of course, the cyclic molecule may also be of other structures, which is not limited.

Optionally, after the quantum dot material shown in FIG. 3 and a cyclic molecule material shown in FIG. 2 are mixed, if the quantum dot material has the structure shown in FIG. 4, the negative charge balance ion Z$^-$ in FIG. 4 bonds with the hydrogen atoms (H) in the central region of the cyclic molecule shown in FIG. 2; and if the quantum dot material has the structure as shown in FIG. 5, the anionic complex Y$^-$ in FIG. 5 bonds with the hydrogen atoms (H) in the central region of the cyclic molecule shown in FIG. 2. Therefore, by adopting ligands including ionic complex groups as the ligands of quantum dots, anions therein may tightly bond with the cyclic molecules through electrostatic force, so that the quantum dots QD may be isolated by the isolation units 100 with the cyclic molecule structures, as shown in FIG. 1, thereby avoiding fluorescence quenching caused by mutual contact of the quantum dots, and improving the fluorescence efficiency of the quantum dot material.

Optionally, in the quantum dot material provided by embodiments of the present disclosure, as shown in FIG. 1, a distance between the adjacent quantum dots QD is 5 nm-20 nm.

Optionally, in the quantum dot material provided by embodiments of the present disclosure, as shown in FIG. 3, the role of the coordination group X is to bond with the surface of the quantum dot QD. The coordination group X may include at least one of the following: amino, polyamino, hydroxyl, polyhydroxyl, sulfhydryl, polysulfhydryl, sulfide, polysulfide, phosphine, phosphine oxid and other functional groups or elements that may bond with the surfaces of the quantum dots.

Optionally, in the quantum dot material provided by embodiments of the present disclosure, as shown in FIG. 3, the role of the linking group Q is to improve the solubility of the quantum dots in a solvent. The linking group Q may include at least one of the following: ethyl, n-butyl, t-butyl, n-octyl, t-butyl phenyl, methoxy and n-butoxy.

In in the quantum dot material provided by embodiments of the present disclosure, the quantum dots are generally inorganic quantum dots. The inorganic quantum dots may be, for example, cadmium sulfide (CdS), cadmium selenide (CdSe), cadmium antimonide (CdTe), zinc selenide (ZnSe), indium phosphide (InP), lead sulfide (PbS), copper indium sulfide (CuInS2), zinc oxide (ZnO), cesium lead chloride (CsPbCl3), cesium lead bromide (CsPbBr3), cesium lead iodide (CsPbI3), cadmium sulfide/zinc sulfide (CdS/ZnS), cadmium selenide/zinc sulfide (CdSe/ZnS), zinc selenide (ZnSe), indium phosphide/zinc sulfide (InP/ZnS), lead sulfide/zinc sulfide (PbS/ZnS), indium arsenide (InAs), indium gallium arsenide (InGaAs), indium gallium nitride (InGaN), gallium nitride (GaN), zinc telluride (ZnTe), silicon (Si), germanium (Ge), carbon (C) and other nano-scale materials with the above compositions, such as nanorod materials.

Optionally, from the perspective of environmental protection, the inorganic quantum dots are quantum dots that do not contain cadmium, so as to avoid the harm of heavy metal cadmium to the environment and the human body, and effectively avoid the pollution of heavy metals. Of course, without considering the problem of heavy metal pollution, the inorganic quantum dots may also be cadmium-containing quantum dots, which is not limited here.

Figure 6:
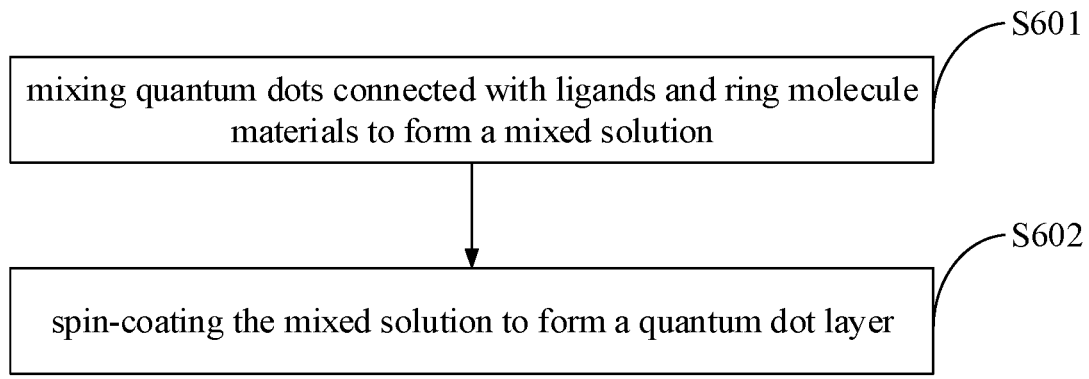
FIG. 6 is a schematic flow chart of a manufacturing method of a quantum dot layer provided by an embodiment of the disclosure.

Based on the same inventive concept, an embodiment of the present disclosure also provides a manufacturing method of a quantum dot layer. The quantum dot layer includes the quantum dot material provided by the embodiment of the present disclosure. As shown in FIG. 6, the manufacturing method includes:

S601, a quantum dot connected with a ligand is mixed with a cyclic molecule material to form a mixed solution, optionally, the quantum dot material with the structure shown in FIG. 4 is mixed with the cyclic molecule material shown in FIG. 2 to form the mixed solution;

S602, the mixed solution is coated or printed to form the quantum dot layer, optionally, the mixed solution formed in step 601 is coated or printed to form the quantum dot layer.

Figure 7:
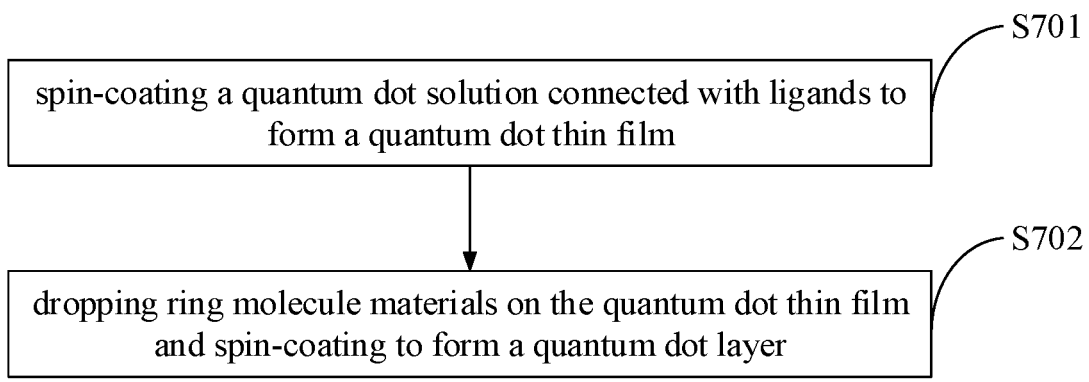
FIG. 7 is a schematic flow chart of another manufacturing method of a quantum dot layer provided by an embodiment of the disclosure.

Alternatively, as shown in FIG. 7, the manufacturing method of the quantum dot layer includes:

S701, a quantum dot solution connected with the ligand is coated or printed to form a quantum dot thin film, optionally, a quantum dot material solution with the structure shown in FIG. 4 is coated or printed to form the quantum dot thin film;

S702, the cyclic molecule material is dropped on the quantum dot thin film, and coating or printing is performed to form the quantum dot layer, the cyclic molecule material shown in FIG. 2 is dropped on the quantum dot thin film formed in step 701, and the cyclic molecule material is coated or printed to form the quantum dot layer.

In some embodiments, a preparation method of the quantum dot material may adopt thermal injection, and ligands containing ionic complex groups on the surface of a quantum dot may be directly formed. Of course, generally synthesized ligands on the surface of the quantum dot include long-chain organic ligands such as oleylamine, oleic acid, trimethylamine, trioctylphosphine oxide, and dodecanethiol, so that the ligands containing the ionic complex groups may also be formed by way of ligand exchange.

Based on the same inventive concept, an embodiment of the present disclosure also provides a quantum dot light emitting device. Since the principle of solving the problem of the quantum dot light emitting device is similar to that of the quantum dot layer, the implementation of the quantum dot light emitting device may be referred to the implementation of the quantum dot layer, which is not repeated here.

Figure 8:
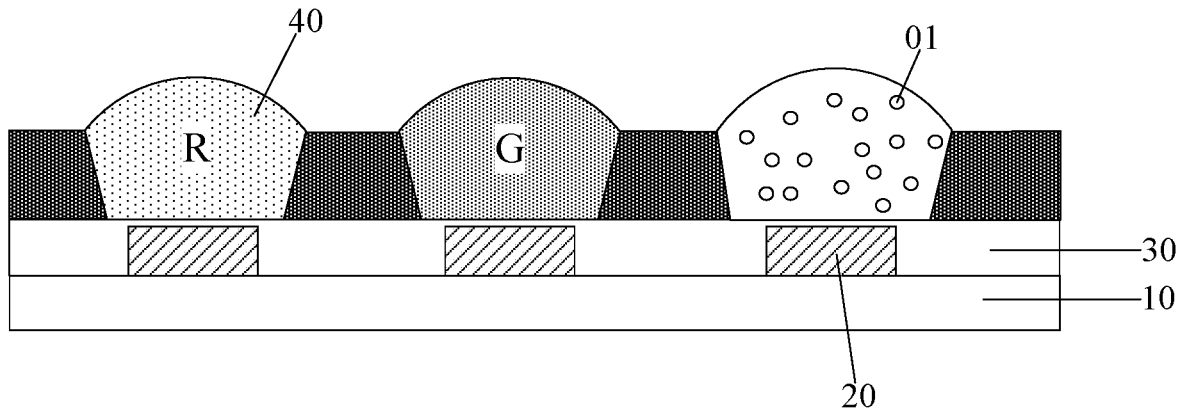
FIG. 8 is a schematic structural diagram of a quantum dot light emitting device provided by an embodiment of the disclosure.

The quantum dot light emitting device, as shown in FIG. 8, includes:
- a drive substrate 10;
- a plurality of light emitting units 20, disposed in an array on the drive substrate 10;
- an insulating layer 30, located on a side, facing away from the drive substrate 10, of the plurality of light emitting units 20; and
- a color film layer 40, located on a side, facing away from the drive substrate 10, of the insulating layer 30, wherein a material of the color film layer 40 is the quantum dot material shown in FIG. 1 disclosed by embodiments of the present disclosure.

According to the quantum dot light emitting device shown in FIG. 8 provided by the embodiment of the present disclosure, the quantum dot material disclosed in the embodiment of the present disclosure is used to manufacture the color film layer 40. Because the quantum dot material (as shown in FIG. 1) includes isolation units 100, the isolation units 100 are cyclic molecules, ligands W connected with quantum dots QD are configured to bond with the cyclic molecules through electrostatic force, and the isolation units 100 tightly bonding with the ligands W are formed on the outer surface of an overall structure of each quantum dot QD and the ligands, the quantum dots QD are wrapped with the multiple isolation units 100, avoiding the problem of fluorescence quenching caused by the contact of adjacent quantum dots and improving the light emitting efficiency of the quantum dot material. Therefore, through adopting the quantum dot material shown in FIG. 1 to manufacture the color film layer 40 of the quantum dot light emitting device shown in FIG. 8, the light emitting efficiency of the quantum dot light emitting device shown in FIG. 8 may be improved.

Optionally, as shown in FIG. 8, the light emitting units 20 may be micro LEDs, or mini LEDs or other LEDs, which is not limited in the present disclosure.

Optionally, since the light emitting units generally emit blue light, as shown in FIG. 8, the color film layer only needs to have a red color film layer R and a green color film layer G to achieve full-color display.

In some embodiments, as shown in FIG. 8, a region where a blue color film layer is originally needed is filled with scattering particles 01. Optionally, by doping the scattering particles 01 in a resin material, and then using the resin material doped with the scattering particles 01 to fill the region where the blue color film layer is originally needed, the scattering particles may enhance the light output effect and increase the light emitting viewing angle.

Optionally, as shown in FIG. 8, the thickness of the color film layer 40 may be 1 μm-10 μm.

Optionally, as shown in FIG. 8, the drive substrate 10 includes a thin film transistor array. In addition, the quantum dot light emitting device shown in FIG. 8 also includes other functional thin film layers well known to those skilled in the art, which will not be described in detail here.

Figure 9:
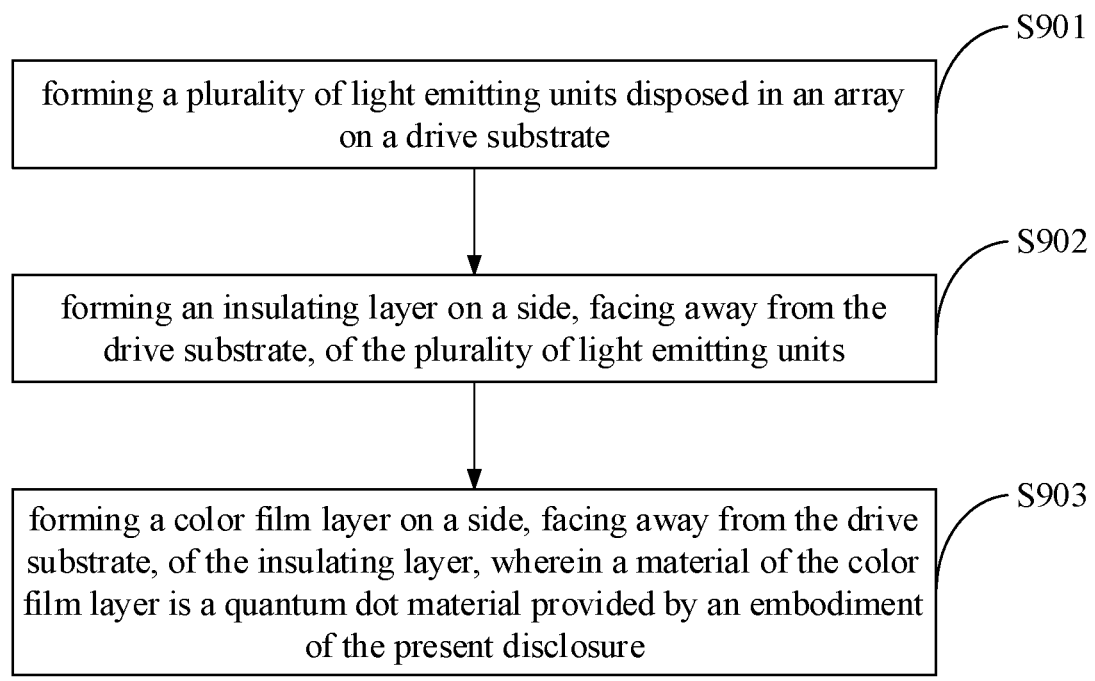
FIG. 9 is a schematic flow chart of a manufacturing method of the quantum dot light emitting device shown in FIG. 8 provided by an embodiment of the disclosure.

Based on the same inventive concept, an embodiment of the present disclosure also provides a manufacturing method of a quantum dot light emitting device, as shown in FIG. 9, including:

S901, a plurality of light emitting units disposed in an array are formed on a drive substrate;

S902, an insulating layer is formed on a side, facing away from the drive substrate, of the plurality of light emitting units; and S903, a color thin film layer is formed on a side, facing away from the drive substrate, of the insulating layer, wherein a material of the color thin film layer is the quantum dot material provided by embodiments of the present disclosure.

Forming the color thin film layer specifically includes:

quantum dots connected with ligands are mixed with cyclic molecule materials to form a mixed solution; and the mixed solution is coated or printed on a side, facing away from the drive substrate, of the insulating layer to form the color thin film layer, or, a quantum dot solution connected with the ligand is coated or printed on the side, facing away from the drive substrate, of the insulating layer to form a quantum dot thin film; and the cyclic molecule material is dropped on the quantum dot thin film, and coating or printing is performed to form the color thin film layer.

Based on the same inventive concept, an embodiment of the present disclosure also provides another quantum dot light emitting device. Since the principle of solving the problem of the quantum dot light emitting device is similar to that of the quantum dot layer, the implementation of the quantum dot light emitting device may refer to the implementation of the quantum dot layer, which is not repeated here.

Figure 10A:
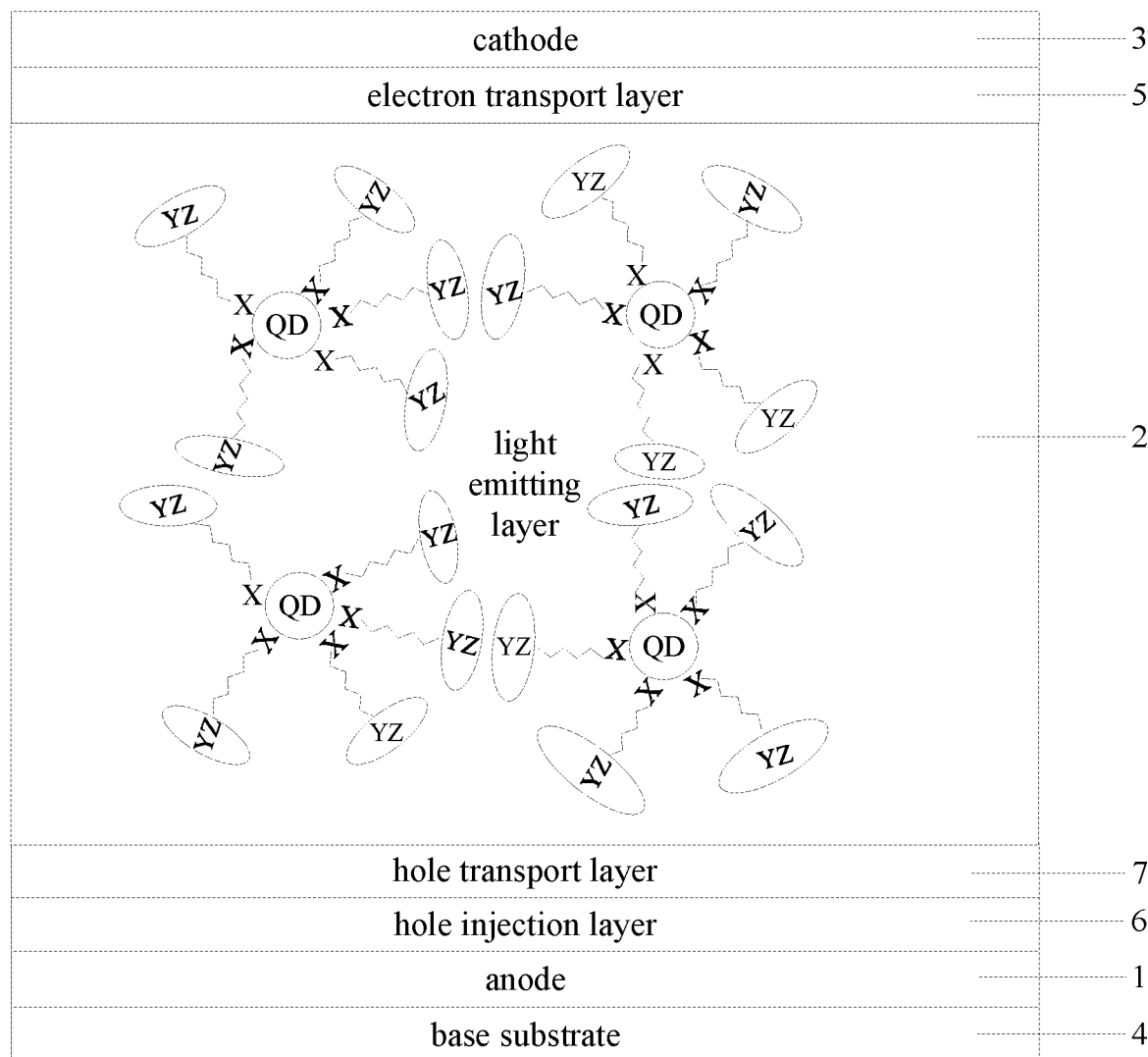
FIG. 10A is a schematic structural diagram of yet another quantum dot light emitting device provided by an embodiment of the disclosure.
Figure 10B:
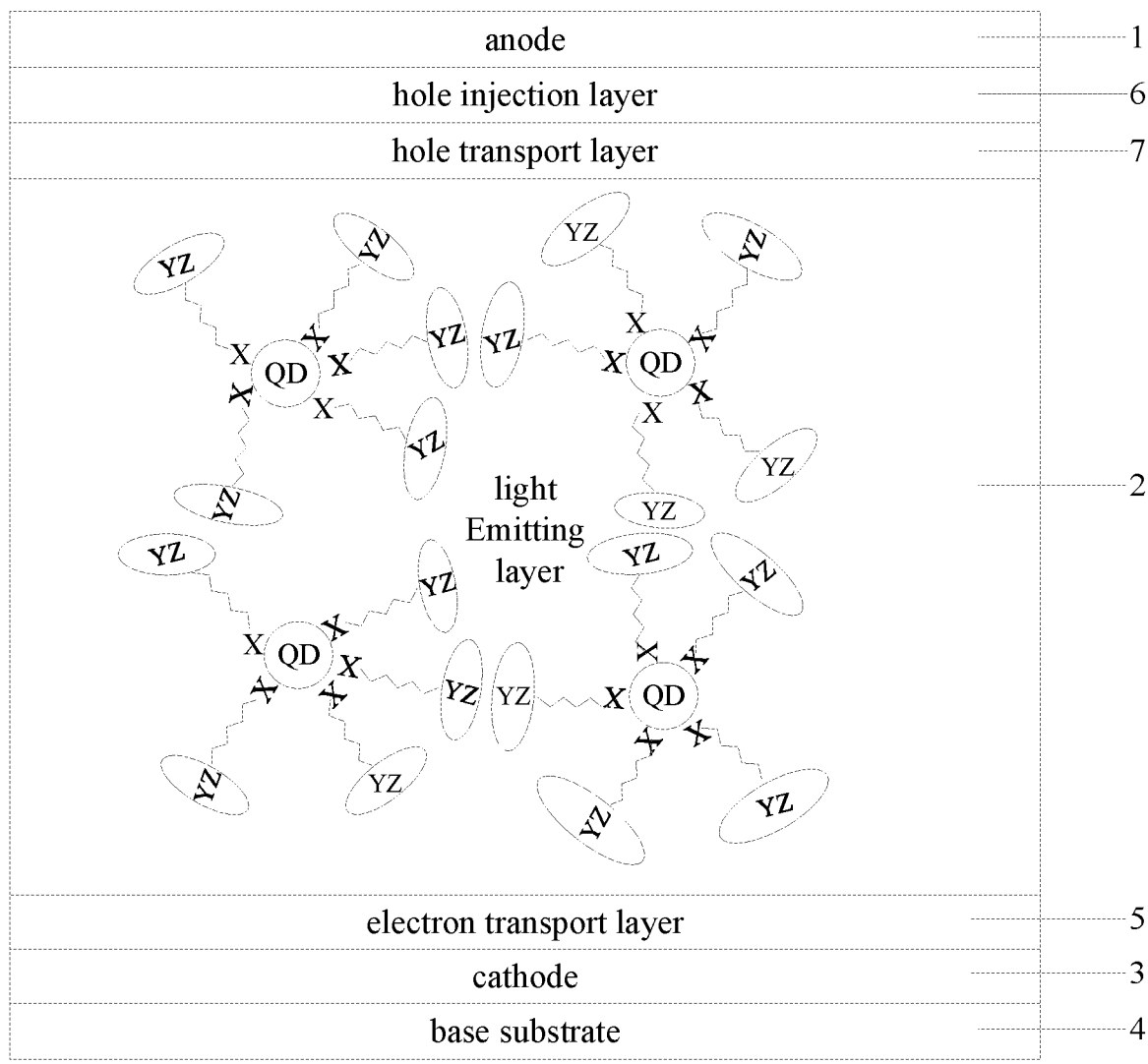
FIG. 10B is a schematic structural diagram of yet another quantum dot light emitting device provided by an embodiment of the disclosure.

As shown in FIGS. 10A and 10B, the quantum dot light emitting device includes: an anode 1, a light emitting layer 2 and a cathode 3 disposed in a laminated manner. A material of the light emitting layer 2 is the quantum dot material shown in FIG. 1 provided by embodiments of the present disclosure.

Optionally, in the quantum dot light emitting device provided by embodiments of the present disclosure, as shown in FIG. 10A, the quantum dot light emitting device has an upright structure, and includes: a base substrate 4, and the anode 1, a hole injection layer 6, a hole transport layer 7, the light-emitting layer 2, an electron transport layer 5 and the cathode 3 laminated in sequence on the base substrate 4.

Optionally, in the quantum dot light emitting device provided by embodiments of the present disclosure, as shown in FIG. 10B, the quantum dot light emitting device has an inverted structure, and includes: the base substrate 4, and the cathode 3, the electron transport layer 5, the light emitting layer 2, the hole transport layer 7, the hole injection layer 6, and the anode 1 laminated in sequence on the base substrate 4.

Based on the same inventive concept, an embodiment of the present disclosure also provides a manufacturing method of a quantum dot light emitting device, including:
forming an anode, a light emitting layer and a cathode disposed in a laminated manner, wherein a material of the light emitting layer is the quantum dot material shown in FIG. 1 provided by embodiments of the present disclosure.

Figure 11:
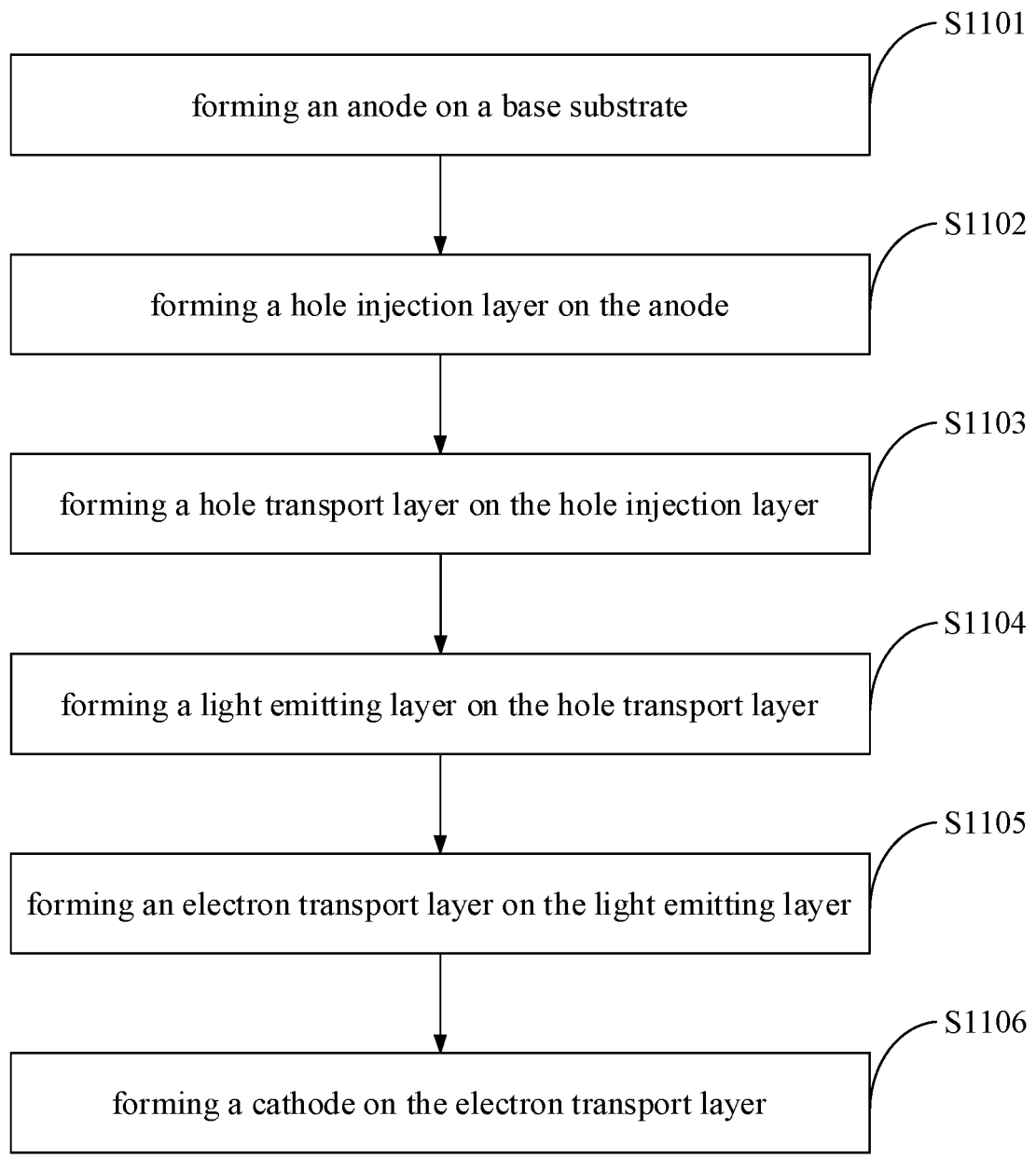
FIG. 11 is a schematic flow chart of a manufacturing method of the quantum dot light emitting device shown in FIG. 10A provided by an embodiment of the disclosure.

Optionally, the manufactured quantum dot light emitting device may adopt the upright device structure as shown in FIG. 10A. A manufacturing process, as shown in FIG. 11, includes:
S1101, the anode is formed on a base;
S1102, a hole injection layer is formed on the anode;
S1103, a hole transport layer is formed on the hole injection layer;
S1104, the light emitting layer is formed on the hole transport layer;
S1105, an electron transport layer is formed on the light emitting layer; and
S1106, the cathode is formed on the electron transport layer.

Forming the light emitting layer specifically includes:
quantum dots connected with ligands are mixed with cyclic molecule materials to form a mixed solution; and
the mixed solution is coated or printed on the hole transport layer to form the light emitting layer,
or,
a quantum dot solution connected with the ligands is coated or printed on the hole transport layer to form a quantum dot thin film; and
the cyclic molecule materials are dropped on the quantum dot thin film, and coating or printing is performed to form the light emitting layer.

Figure 12:
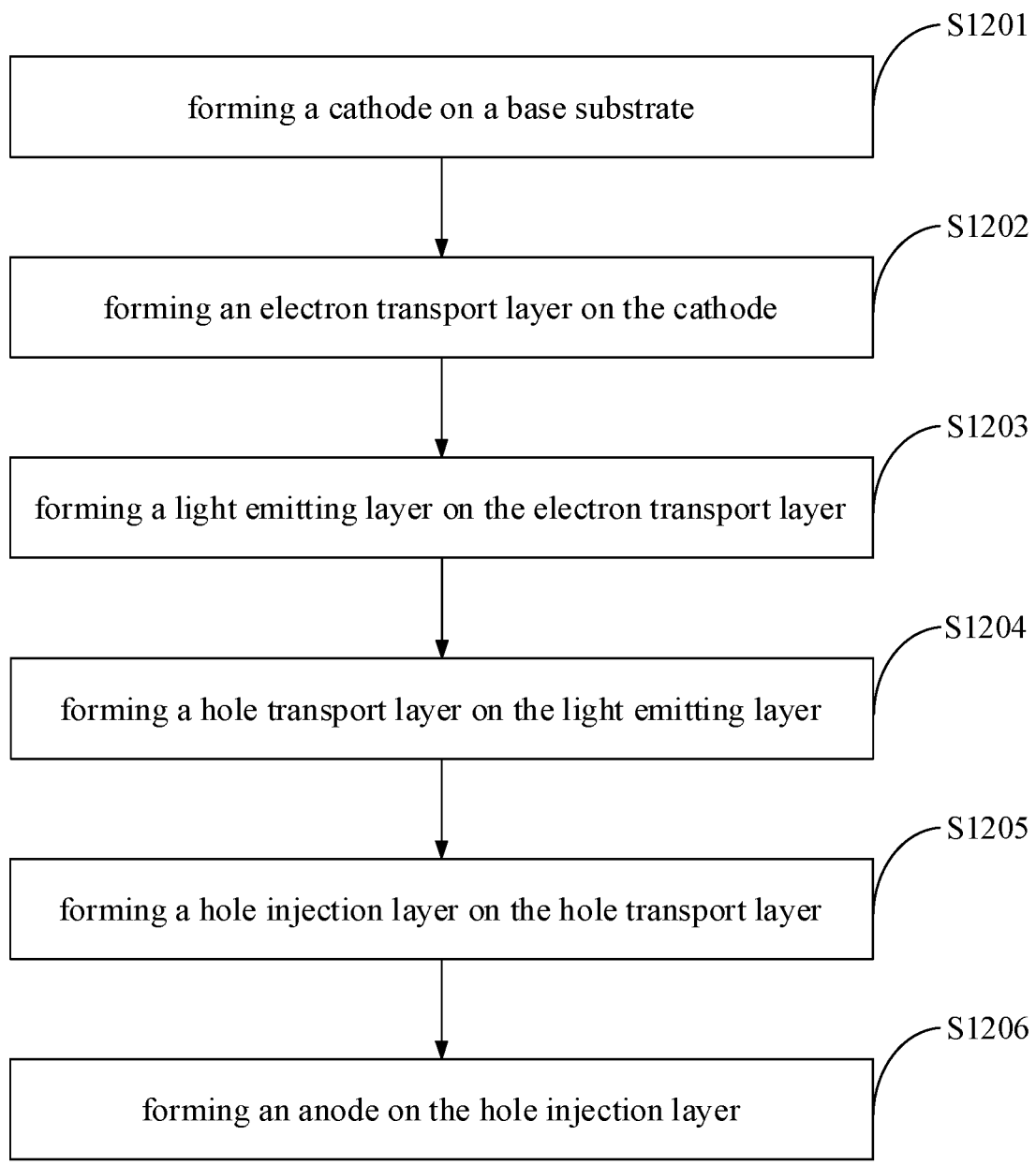
FIG. 12 is a schematic flow chart of a manufacturing method of the quantum dot light emitting device shown in FIG. 10B provided by an embodiment of the disclosure.

Optionally, the manufactured quantum dot light emitting device may adopt the inverted device structure as shown in FIG. 10B. A manufacturing process, as shown in FIG. 12, includes:
S1201, a cathode is formed on a base;
S1202, an electron transport layer is formed on the cathode;
S1203, a light emitting layer is formed on the electron transport layer;
S1204, a hole transport layer is formed on the light emitting layer;
S1205, a hole injection layer is formed on the hole transport layer; and
S1206, an anode is formed on the hole injection layer.

Forming the light emitting layer includes:
the quantum dots connected with ligands are mixed with cyclic molecule materials to form a mixed solution; and
the mixed solution is coated or printed on the electron transport layer to form the light emitting layer,
or,
a quantum dot solution connected with the ligands is coated or printed on the electron transport layer to form a quantum dot thin film; and
the cyclic molecule materials are dropped on the quantum dot thin film, and coating or printing is performed to form the light emitting layer.

In addition, the quantum dot light emitting device may also include other functional thin film layers, such as an electron injection layer between the electron transport layer and the cathode, which will not be described in detail here.

Optionally, the base substrate in some embodiments of the present disclosure may be glass or a flexible PET substrate. A preparation material of the anode may be transparent ITO, FTO, or conductive polymer, etc., or opaque metal electrodes such as Al and Ag. A material of the electron transport layer is preferably zinc oxide particles. A material of the hole transport layer may be organisms such as polyvinylcarbazole (PVK), 2,4,4'-trifluorobenzophenone (TFB) and TPD, or inorganic oxides such as NiOx and VOx. A preparation material of the hole injection layer may be organic injection materials such as PEDOT: PSS, or inorganic oxides such as MoOx. A preparation material of the cathode may be a transparent electrode such as ITO, thin Al and Ag, or opaque electrodes, for example, thick metal electrodes such as Al and Ag.

Taking the inverted device structure as an example, a manufacturing process of the quantum dot light emitting device is described in detail below, including the following steps:
(1) the cathode is formed on the base, specifically, the base substrate may be glass or a flexible PET substrate, the cathode material may be transparent ITO, FTO, conductive polymers, etc., or opaque metal materials such as Al and Ag;
(2) ZnO or an Mg, Al, Zr or Y doped ZnO film is deposited on the cathode by magnetron sputtering as the electron transport layer. The thickness of the electron transport layer can be deposited as required, and the thickness is between 50 nm-300 nm;
(3) the light-emitting layer (20 nm-50 nm) is formed on the electron transport layer through a method of manufacturing the light emitting layer in FIG. 12;
(4) the hole transport layer and the hole injection layer are sequentially formed on the light emitting layer through coating, printing or evaporation, specifically, the hole injection layer may be selected from PEDOT:PSS 4083(poly3,4-ethylenedioxythiophene/polystyrene sulfonate) or other compounds; and
(5) the anode is formed on the hole injection layer, specifically, the anode material may be metal Al, Ag, etc., or the magnetron sputtering may be used to deposit IZO to form the anode, and the thickness of the anode may be 10 nm-100 nm.

Based on the same inventive concept, an embodiment of the present disclosure also provides a display apparatus, including the quantum dot light emitting device provided by the embodiment of the present disclosure. Since the principle of solving the problem of the display apparatus is similar to that of the quantum dot light emitting device, the implementation of the display apparatus may refer to the implementation of the quantum dot light emitting device, which is not repeated here.

In the display apparatus provided by embodiments of the present disclosure may be a full-screen display device, or a flexible display device, or the like, which is not limited here.

Figure 13:
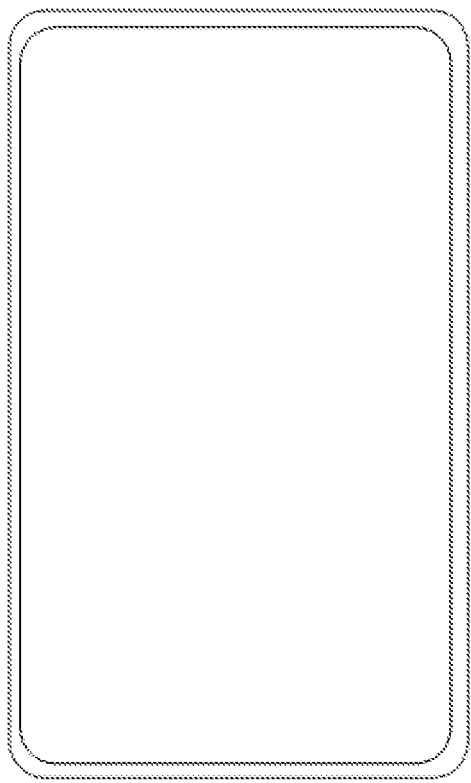
FIG. 13 is a schematic structural diagram of a display apparatus provided by an embodiment of the disclosure.

In the display apparatus provided by embodiments of the present disclosure may be a full-screen mobile phone as shown in FIG. 13. Of course, the display apparatus provided by embodiments of the present disclosure may also be any product or component with display function, such as a tablet computer, a television, a monitor, a notebook computer, a digital photo frame and a navigator. Other essential components of the display apparatus will be apparent to those ordinarily skilled in the art and are not described in detail herein, nor should they be construed as limiting the present disclosure.

Some embodiments of the present disclosure provide the quantum dot material and related applications. The quantum dot material includes: the quantum dots, and the ligands connected with the quantum dots, and further includes the isolation units. The isolation units are the cyclic molecules, and the ligands are configured to bond with the cyclic molecules through electrostatic force, so that the quantum dots and the ligands are wrapped with the multiple isolation units. The isolation units are configured to isolate the quantum dots. The isolation units are the cyclic molecules, the ligands connected with the quantum dots are configured to bond with the cyclic molecules through electrostatic force, and then each isolation unit tightly bonding with the corresponding ligand is formed on the outer surface of the overall structure of the corresponding quantum dot and the ligand, so that the overall structure of the quantum dot and the ligand is wrapped with the isolation unit, and the problem of fluorescence quenching caused by the contact of the adjacent quantum dots is avoided, thereby improving the light emitting efficiency of the quantum dot layer, and improving the light emitting efficiency of the light emitting device where the quantum dot layer is located.

Although preferred embodiments of the present disclosure have been described, additional variations and modifications may be made to these embodiments by those skilled in the art once the basic inventive concept is known. Therefore, it is intended that the appended claims be interpreted as including the preferred embodiments and all alterations and modifications that fall within the scope of the disclosure.

It will be apparent to those skilled in the art that various modifications and variations can be made in the disclosed embodiments without departing from the spirit or scope of the disclosed embodiments. Thus, it is intended that the present disclosure cover the modifications and variations of the disclosure provided they come within the scope of the appended claims and their equivalents.

What is claimed is:

1. A quantum dot material, comprising: quantum dots, and ligands connected with the quantum dots, and further comprising isolation units, wherein the isolation units are cyclic molecules, and the ligands are configured to bond with the cyclic molecules through an electrostatic force, so that the quantum dots and the ligands are wrapped with the multiple isolation units; and the isolation units are configured to isolate the quantum dots.

2. The quantum dot material according to claim 1, wherein each of the ligands comprises: a coordination group bonding with a corresponding quantum dot, a linking group connected with the coordination group, an ionic complex group connected with the linking group, and a charge balance ion; the ionic complex group and the charge balance ion are bond with each other and are opposite in charge; and
    the ionic complex group or the charge balance ion is configured to bond with a corresponding cyclic molecule through the electrostatic force.

3. The quantum dot material according to claim 2, wherein the ionic complex groups is a cationic complex, the charge balance ions are a negative charge balance ion, and the negative charge balance ion is configured to bond with the cyclic molecules through the electrostatic force.

4. The quantum dot material according to claim 3, wherein a material of the cationic complex is a first organometallic complex, and the first organometallic complex comprises a first central metal ion and a ligand of the first central metal ion; the first central metal ion comprises one of Ir, La, Nd, Eu, Cu, In, Pb or Pt; and the ligand of the first central metal ion comprises one of o-phenanthroline, 2-phenylpyridine, phenyloxadiazole pyridine, fluorophenylpyridine or bipyridine.

5. The quantum dot material according to claim 4, wherein a material of the negative charge balance ion is a second organometallic complex, and the second organometallic complex comprises a second central metal ion and a ligand of the second central metal ion; the second central metal ion comprises one of Ir, La, Nd, Eu, Cu, In, Pb or Pt; the ligand of the second central metal ion comprises one of tetrakis(pentafluorophenyl)boric acid, tetrakis[(trifluoromethyl)phenyl]boric acid, tetrakis[bis(trifluoromethyl)phenyl]boric acid, hexa(pentafluorophenyl)phosphoric acid, hexa[(trifluoromethyl)phenyl]phosphoric acid or hexa[bis(trifluoromethyl)phenyl]phosphoric acid;

or, the negative charge balance ion is one of

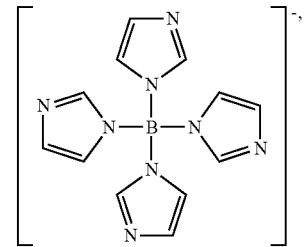

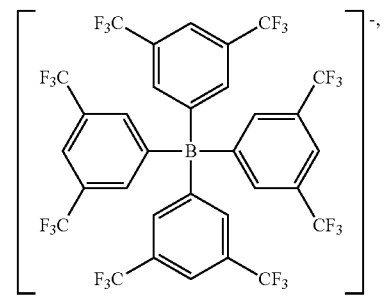

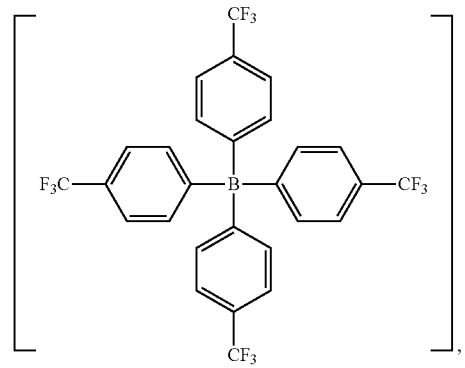

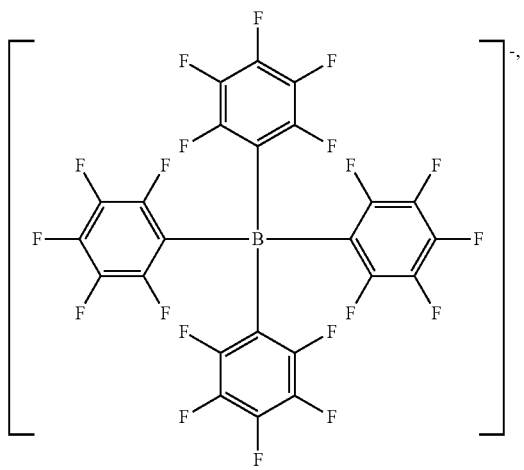

(?) indicates text missing or illegible when filed $ClO_4^-$, $BF_3^-$, $Cl^-$ or $PF_6^-$.

6. The quantum dot material according to claim 2, wherein the ionic complex groups are a anionic complex, the charge balance ion is a positive charge balance ion, and the anionic complex is configured to bond with the cyclic molecules.

7. The quantum dot material according to claim 6, wherein a material of the anionic complex is a second organometallic complex, and the second organometallic complex comprises a second central metal ion and a ligand of the second central metal ion; the second central metal ion comprises one of Ir, La, Nd, Eu, Cu, In, Pb or Pt; the ligand of the second central metal ion comprises one of tetrakis (pentafluorophenyl)boric acid, tetrakis[(trifluoromethyl) phenyl]boric acid, tetrakis[bis(trifluoromethyl)phenyl]boric acid, hexa(pentafluorophenyl)phosphoric acid, hexa[(trifluoromethyl)phenyl]phosphoric acid or hexa[bis(trifluoromethyl)phenyl]phosphoric acid; or the anionic complex is one of:

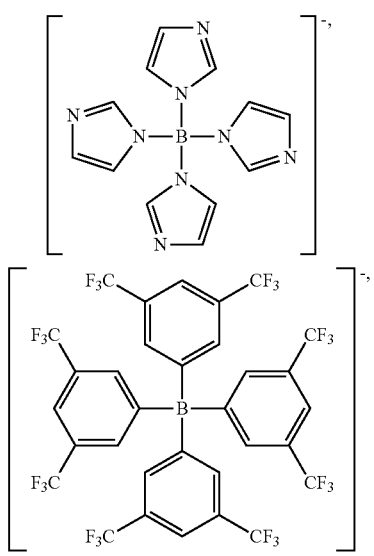

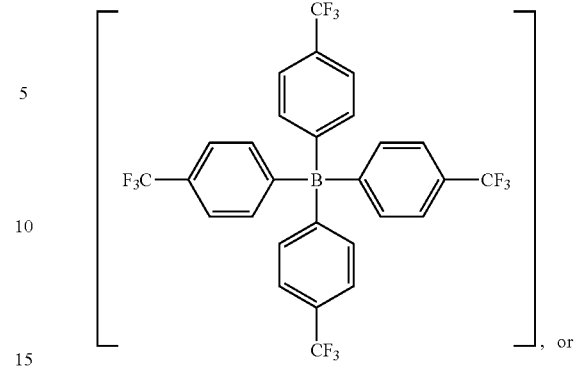

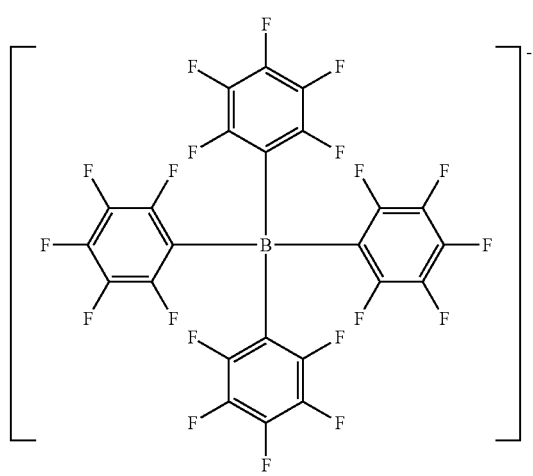

8. The quantum dot material according to claim 7, wherein a material of the positive charge balance ion is a first organometallic complex, and the first organometallic complex comprises a first central metal ion and a ligand of the first central metal ion; the first central metal ion comprises one of Ir, La, Nd, Eu, Cu, In, Pb or Pt; the ligand of the first central metal ion comprises one of o-phenanthroline, 2-phenylpyridine, phenyloxadiazole pyridine, fluorophenylpyridine or bipyridine; or the positive charge balance ion is $NH_4^+$ or $Na^+$.

9. The quantum dot material according to claim 1, wherein the cyclic molecules comprise hydrogen atoms, and the ligands are configured to bond with the hydrogen atoms through the electrostatic force.

10. The quantum dot material according to claim 1, wherein each cyclic molecule comprises a cyclic molecule structure formed by connecting n repeating units in sequence, and $4 \leq n \leq 10$.

11. The quantum dot material according to claim 10, wherein the cyclic molecules comprise: polymers of styrene or polymers of styrene derivatives.

12. The quantum dot material according to claim 10, wherein a structure of each of the cyclic molecules is

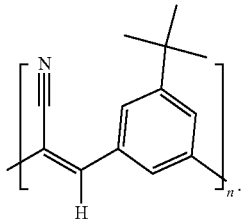

13. The quantum dot material according to claim 12, wherein the structure of each cyclic molecule is:

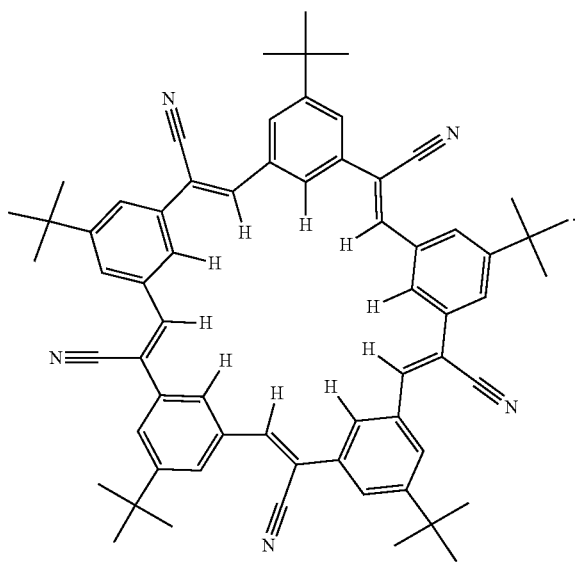 [SMILES: CC(C)(C)c1cc2cc(c1)/C(C#N)=C/c1cc(cc(C(C)(C)C)c1)/C(C#N)=C/c1cc(cc(C(C)(C)C)c1)/C(C#N)=C/c1cc(cc(C(C)(C)C)c1)/C(C#N)=C/c1cc(cc(C(C)(C)C)c1)/C(C#N)=C/2]

14. The quantum dot material according to claim 1, wherein a distance between adjacent quantum dots is 5 nm-20 nm.

15. The quantum dot material according to claim 2, wherein each of the linking groups comprises at least one of: ethyl, n-butyl, t-butyl, n-octyl, t-butyl phenyl, methoxy or n-butoxy.

16. The quantum dot material according to claim 2, wherein each coordination group comprises at least one of: amino, polyamino, hydroxyl, polyhydroxyl, sulfhydryl, polysulfhydryl, sulfide, polysulfide, phosphine or phosphine oxide.

17. A quantum dot light emitting device, comprising:
a drive substrate;
a plurality of light emitting units, disposed in an array on the drive substrate;
an insulating layer, located on a side, facing away from the drive substrate, of the plurality of light emitting units; and
a color thin film layer, located on a side, facing away from the drive substrate, of the insulating layer, wherein a material of the color thin film layer is the quantum dot material according to claim 1.

18. A quantum dot light emitting device, comprising: an anode, a light emitting layer and a cathode disposed in a laminated manner, wherein a material of the light emitting layer is the quantum dot material according to claim 1.

19. The quantum dot light emitting device according to claim 18, comprising: a substrate, and the anode, a hole injection layer, a hole transport layer, the light emitting layer, an electron transport layer and the cathode laminated in sequence on the substrate.

20. The quantum dot light emitting device according to claim 18, comprising: a substrate, and the cathode, an electron transport layer, the light emitting layer, a hole transport layer, a hole injection layer and the anode laminated on the base in sequence.

* * * * *